United States Patent [19]

Jacoboni et al.

[11] Patent Number: 5,454,847
[45] Date of Patent: Oct. 3, 1995

[54] VAPOR DEPOSITION METHOD FOR DEPOSITING A FILM OF FLUORINE-CONTAINING GLASS ON A SUBSTRATE

[75] Inventors: Charles Jacoboni, Ste Jamme; Brigitte Boulard, Le Mans; Olivier Perrot, Laval, all of France

[73] Assignee: Alcatel Alsthom Compagnie Generale d'Electricite, Paris, France

[21] Appl. No.: 121,884

[22] Filed: Sep. 17, 1993

[30]     Foreign Application Priority Data

Sep. 18, 1992 [FR]   France .................................. 92 11158

[51] Int. Cl.⁶ ...................................................... C03B 8/04
[52] U.S. Cl. ............................. 65/386; 65/388; 65/413; 65/60.7; 65/DIG. 16; 65/390; 427/166
[58] Field of Search ..................................... 65/3.12, 60.2, 65/DIG. 16, 388, 390, 386, 413, 60.7; 427/163, 166

[56]              References Cited

U.S. PATENT DOCUMENTS 5,071,460 12/1991 Fujiura et al. ........................... 65/3.12

FOREIGN PATENT DOCUMENTS

0309117A1   3/1989   European Pat. Off. ..
0500122A1   8/1992   European Pat. Off. ..
WO9008743   8/1990   WIPO .

OTHER PUBLICATIONS

Japanese Patent Abstract 63–199860 dated Aug. 18, 1988.

Primary Examiner—W. Gary Jones
Assistant Examiner—John Hoffmann
Attorney, Agent, or Firm—Sughrue, Mion, Zinn, Macpeak & Seas

[57]                ABSTRACT

A deposition method for vapor deposition of a film of fluorine-containing glass on a substrate in which said substrate is put into contact with fluxs of the vapors of the various constituents of said glass, wherein said vapor fluxs are emitted simultaneously from at least two crucibles, a first crucible containing a host bath and main metal fluorides that constitute said fluorine-containing glass, and at least one second crucible containing dopants constituted by at least one rare earth halide.

8 Claims, 1 Drawing Sheet

VAPOR DEPOSITION METHOD FOR DEPOSITING A FILM OF FLUORINE-CONTAINING GLASS ON A SUBSTRATE

The present invention relates to a vapor deposition method for depositing a fluorine-containing glass on a substrate. The fluorine-containing glasses concerned are described, in particular, in patent FR-A-2 452 469 and in its first certificate of addition FR-A-2 479 797.

BACKGROUND OF THE INVENTION

Such fluorine-containing glasses have the property of presenting a wide window of transparency (wavelengths generally lying in the range 0.3 micrometers to 8 micrometers) and in particular, in the mid-infrared, of presenting ultratransparency considerably greater than that of silica.

The field of application for fluorine-containing glasses can thus extend from long distance telecommunications using very low loss optical fibers to laser fibers for microsurgery, and in general to components for integrated optics.

It is known that the preparation of optical components and fibers requires materials of very high purity. In particular, certain cations such as iron, cobalt, nickel, etc. must not be present at concentrations any greater than 10 to 50 parts per billion ($10^9$, ppb). Conventional methods of manufacturing pieces made of fluorine-containing glass by melting and by quenching give rise to large amounts of pollution by contact with the receptacles used for melting and for casting. It is therefore highly advantageous to be able to prepare fluorine-containing glasses by vapor deposition in order to avoid such drawbacks.

However, it is difficult to use the usual vapor deposition technique because of the chemical complexity of fluorine-containing vitreous systems. Fluorine-containing glasses generally include at least four constituents. Thus, although the composition of a vapor in equilibrium over a binary mixture can generally be predicted, adding other constituents makes the evaporation more complex and the theoretical ratios of the constituents are no longer obtained in the vapor. In general, the molten mixture in a crucible becomes enriched with one or more constituents that are less volatile than the others, such that the change in the composition of the liquid to be evaporated rapidly departs from the thermal range of the liquidus. Evaporation is then observed to halt and the composition present in the crucible crystallizes.

International patent application WO 90 08 743 shows that it is possible to deposit vapor of fluorine-containing vitreous compositions more easily by melting the constituents of the glass to be deposited in a host bath constituted by a molten mixture of fluorides, itself forming a vitrifiable composition constituted by elements that are less volatile than the fluorides of the glass to be deposited. That technique makes it possible to avoid the difficulties encountered in the direct evaporation method since it has been discovered that the composition of the "host glass" remains substantially constant, or in any event varies sufficiently little for it to be possible to keep the bath in the liquid state.

Nevertheless, there still remains a problem if it is desired to use vapor deposition to obtain a film of fluorine-containing glass on a substrate, where the glass is heavily doped with rare earth. Thus, if fluorides or halides of rare earths are also added to the crucible, it turns out to be impossible to obtain a film having a predetermined composition of rare earths.

OBJECTS AND SUMMARY OF THE INVENTION

An object of the present invention is to provide a vapor deposition method making it possible to control the composition of a film of fluorine-containing glass that is doped with rare earths.

The present invention provides a deposition method for vapor deposition of a film of fluorine-containing glass on a substrate in which said substrate is put into contact with fluxes of the vapors of the various constituents of said glass, wherein said vapor fluxes are emitted simultaneously from at least two crucibles, a first crucible containing a host bath and main metal fluorides that constitute said fluorine-containing glass, and at least one second crucible containing dopants constituted by at least one rare earth halide.

In a preferred implementation, the second crucible contains dopants satisfying the relationship:

$$xYX_3+(1-x)LnX_3$$

where:

$0 \leq x \leq 1$;

Ln=La, Ce, Pr, Nd, Pm, Sm, Eu, Gd, Tb, Dy, Ho, Er, Tm, Yb, Lu;

Y=yttrium;

X=F or Cl; and $LnX_3$ represents a rare earth halide or a mixture of rare earth halides.

The person skilled in the art can choose the thickness of the film of doped fluorine-containing glass that is deposited on the substrate, and also its rare earth doping concentration by controlling the following parameters:

the temperature of each crucible;

the duration of evaporation for each crucible;

the relative positions, vertically and horizontally, of the crucibles; and the positions of the substrate in the evaporation zone.

Film thicknesses can thus be obtained in the range 1 micrometer to several tens of micrometers, and rare earth halide doping concentrations can be up to 15% (molar) of the composition of the glass.

When mixing a plurality of rare earths having thermodynamic properties that are very different, it may be advantageous to distribute them in a plurality of different "second" crucibles that are operated simultaneously for the purpose of obtaining a film of predetermined composition.

Preferably, the vapor flux emitted by said first crucible has the following composition (in molar %; total 100%):

30 to 50 $PbF_2$ 30 to 50 $GaF_3$ or $FeF_3$ or $CrF_3$ 0 to 30 $ZnF_2$ or $CuF_2$ 1 to 5 $MnF_2$ or $CdF_2$ or $CoF_2$ 1 to 5 $InF_3$ 0 to 10 $AlF_3$ 0 to 10 additive.

It is also preferable for said crucible to contain a host bath having the following composition:

9 to 26 $YF_3$ 19 to 28 $BaF_2$ 35 to 40 $InF_3$ 18 to 25 $MnF_2$ or $CdF_2$ or $ZnF_2$ or $CoF_2$ 0 to 10 additive.

The initial mass percentage of the host bath relative to the total mass of the initial bath is great enough to maintain a stable composition in the host bath. For example, it may lie in the range 50% to 90%.

Some of the constituents of the host bath, in particular $InF_3$, $MnF_2$, $CdF_2$, and possibly the additives, are at low concentrations in the deposited fluorine-containing glass. Zinc fluoride may form a part of the host bath, but it may then also be found in the deposited glass at a percentage that is relatively high (e.g. 10% to 30%), thereby conferring increased stability to the deposited glass.

The additive that may optionally be present in the host bath and in the glass to be deposited is constituted, in particular, by one or more metal fluorides, in particular metal fluorides whose metals have octahedral coordination, such as the 3d elements in the periodic table, for example, or else alkali fluorides, e.g. NaF or LiF.

If it is intended to deposit a plurality of fluorine-containing glasses of different main compositions successively on the same substrate, it is advantageous to provide a plurality of "first" crucibles within the same evaporation enclosure for the purpose of receiving said different compositions.

The material of said substrate is selected, for example, from: a fluorine-containing glass, alumina, silica, carbon, a metal, silicon, and a semiconductor material, such as InP or GaAs, for example.

The shape of the substrate may be arbitrary, depending on the intended application: it may be a cylinder, a hollow tube for making an optical fiber preform, or a plate for making a light-guiding structure in integrated optics.

BRIEF DESCRIPTION OF THE DRAWING

Other characteristics and advantages of the present invention appear from the following description of implementations given by way of non-limiting illustration. In the accompanying drawing.

MORE DETAILED DESCRIPTION

Figure 1:
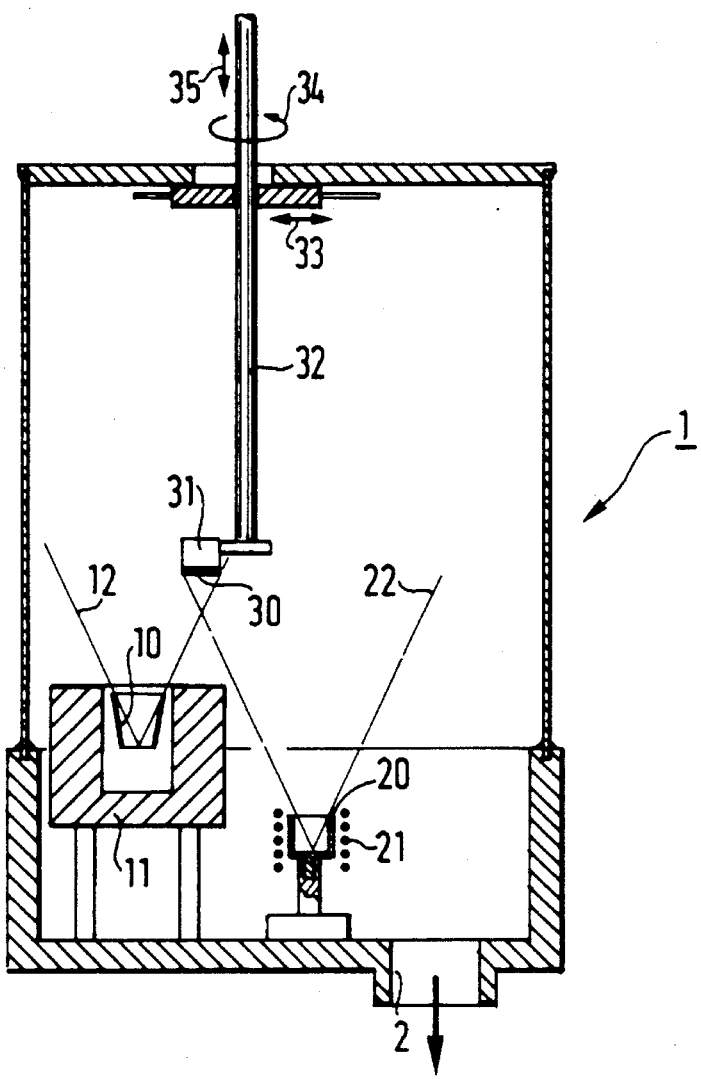
FIG. 1 is a diagram of evaporation apparatus for implementing the method of the invention.

FIG. 1 shows an evaporator 1 connected via 2 to a vacuum pump. It contains a first crucible 10 made of platinum and a second crucible 20 made of graphite (carbon). Each of the crucibles is disposed on a respective support and is induction heated by means of a respective high frequency heater device shown diagrammatically at 11 and 21. These devices 11 and 21 can be controlled independently of each other.

A substrate 30 disposed in a substrate carrier 31 is disposed in the zone common to the cones 12 and 22 of the fluxes emitted by the two crucibles 10 and 20.

The optimum position of the substrate relative to the crucibles is adjustable by means of a support arm 32 using various different motions as represented diagrammatically by arrows 33, 34, and 35.

Masks (not shown) may optionally be disposed, at least to some extent, in front of the substrate.

In all of the following examples, quantities are given in moles (%) or in grams (g).

Example I

Depositing a film of erbium-doped fluorine-containing glass on a substrate 30 made of silica.

The crucible 10 contained 3 g of host bath plus 0.75 g of main metal fluoride mixture. The composition of the host bath was as follows (in mole %):

$5YF_3\text{-}22BaF_2\text{-}37InF_3\text{-}21MnF_2\text{-}5LaF_3$

The main metal fluoride mixture was as follows (in mole %):

$30PbF_2\text{-}50ZnF_2\text{-}20GaF_3$

The crucible 10 was raised to a temperature of 900° C.

The crucible 20 contained 200 mg of $ErF_3$, and it was raised to a temperature of 1180° C.

Coevaporation under the above-specified conditions was performed for 20 minutes and a film was obtained whose main composition was 45% $PbF_2$-18.5% $ZnF_2$-35.5% $GaF_3$-0.1% $CdF_2$, that was doped to 1.42% with $ErF_3$, and that was of thickness e=5 μm.

In another experiment that was entirely similar except that the temperature of the crucible 20 was equal to 1140° C., the thickness of the film was identical, but it was doped with $ErF_3$ to a concentration of 0.68%.

In following Examples II and III, the lanthanide fluoride mixtures were previously homogenized for 12 hours in a sealed tube at 1200° C.

Example II

Depositing a film of fluorine-containing glass doped with yttrium and erbium on a substrate 30 made of silicon.

The crucible 10 was similar to that used in Example I (similar contents and temperature).

The crucible 20 contained 200 mg of a $YF_3$-$ErF_3$ mixture (in a molar ratio of 75/25); and it was raised to 1180° C.

The experiment was performed under the same conditions as in Example I.

The resulting film had the same main composition as in Example I. Its thickness was 5 μm and its doping concentration was 0.2% $ErF_3$ and 1.4% $YF_3$.

Example III

Depositing a film of fluorine-containing glass doped with erbium and yttrium on a substrate 30 made of silica.

The crucible 10 was similar to that of Example I (similar content and temperature).

The crucible 20 contained 200 mg of a $ErF_3$-$YbF_3$ mixture (in a molar ratio of 50/50); and it was raised to 1180° C.

The experiment was performed under the same conditions as in Example I.

The resulting film had the same main composition as in Example I. Its thickness was 5 μm and its doping concentration was 0.7% $ErF_3$ and 0.7% $YbF_3$.

Example IV

Depositing a film of erbium-doped fluorine-containing glass on a substrate 30 made of ZBLAN fluorine-containing glass.

The crucible 10 contained 2 g of host bath as in Example I and 0.5 g of main metal fluoride mixture as in Example I.

The crucible 20 contained a mixture of 0.1844 g of $ErF_3$ and 0.050 g of $ErCl_3$.

Both crucibles were at the same temperature of 570° C.

Coevaporation was performed for 10 minutes.

The main composition of the resulting film was 34% $PbF_2$-31% $ZnF_2$-31% $GaF_3$-2% $InF_3$-2% $CdF_2$; it was 30 μm thick; and its ErF$_3$ doping concentration was 0.05%.

Example V

Depositing a film of fluorine-containing glass doped with neodymium on a substrate 30 made of ZBLAN fluorine-containing glass.

The content of the crucible 10 was analogous to that of Example IV.

The crucible 20 contained a mixture of 0.1825 g of NdF$_3$ and 0.050 g of NdCl$_3$.

Both crucibles were at the same temperature of 550° C.

Coevaporation was performed for 10 minutes.

A film was obtained whose main composition was 33% PbF$_2$-28% ZnF$_2$-35% GaF$_3$-2% InF$_3$-2% CdF$_2$; its thickness was 30 µm; and it was doped with NdF$_3$ to a concentration of 0.01%.

Example VI

Depositing fluorine-containing glass doped with praseodymium and erbium on a substrate 30 made of PB10 fluorine-containing glass.

The contents and the temperature of the crucible 10 was similar to that of Example V.

The crucible 20 contained a mixture of 0.283 g of PrCl$_3$ and 0.137 g of ErCl$_3$. Its temperature was 550° C.

Coevaporation was performed for a period of 10 minutes.

A film was obtained having the same main composition as in Example V, its thickness was 30 µm, and it had the following doping concentrations: 0.07% ErF$_3$ and 0.05% PrF$_3$.

Example VII

Figure 2:
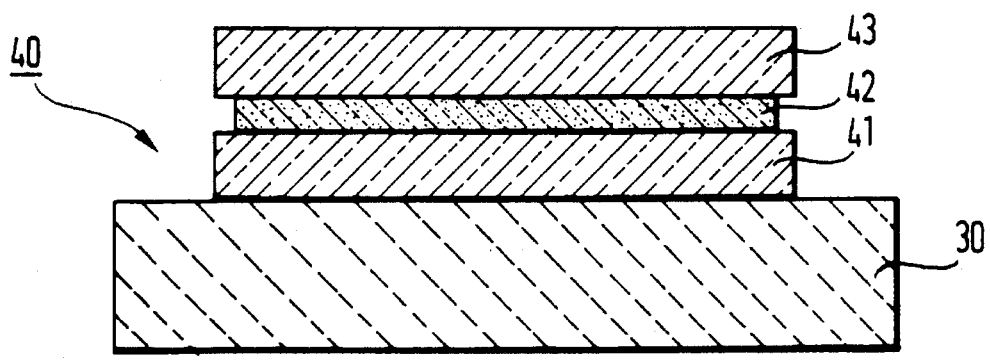
FIG. 2 is a diagrammatic section through an optical component for integrated optics obtained by implementing the method of the invention.

A waveguide 40 was made as shown diagrammatically in section in FIG. 2. The substrate 30 was of ZBLAN fluorine-containing glass.

The following were deposited in succession:

a film 41 of fluorine-containing glass having a refractive index n$_1$;

a film 42 of doped fluorine-containing glass having a refractive index of n$_2$; and a film 43 analogous to the film 41.

This was done by placing in the evaporator 1, an additional crucible 10' (not shown) analogous to the crucible 10;

The crucible 10' contained a mixture of 3 g of host bath analogous to that of Example I and 0.75 g of a mixture of main metal fluorides comprising a mixture of PbF$_2$, ZnF$_2$, and GaF$_3$ in the following molar proportions respectively 20%, 50%, 30%.

The crucible 10 has the same contents as Example I.

The contents of the crucible 20 were selected from the contents of the crucible 20 in Examples I, II, and III.

The film 41 was made initially using the crucible 10' only at 900° C. for a period of 20 minutes.

The composition of the resulting film 41 was as follows: 31% PbF$_2$, 20% ZnF$_2$, 48% GaF$_3$, and 0.1% to 0.5% CdF$_2$.

Thereafter the film 42 was made using both crucibles 10 and 20 as in Examples I to III. The main composition of the fluorine-containing glass was as follows: 46% PbF$_2$, 20% ZnF$_2$, 33% GaF$_3$, 0.1% to 0.5% CdF$_2$.

The erbium, yttrium, or ytterbium doping depended on the contents of the crucible 20.

The refractive indices n$_1$ and n$_2$ lay in the range 1.57 to 1.61.

Finally, the film 43 was made in the same manner as the film 41.

The thickness of the three films can be varied by controlling evaporation times: the thickness of the films 41 and 43 may lie in the range 1 µm to 50 µm or more; the thickness of the film 42 may lie in the range 1 µm to 5 µm or more.

The method of the invention makes it possible to make integrated optical components that combine the functions of source and of waveguide.

Naturally, the invention is not limited to the embodiments described above. Without going beyond the ambit of the invention any means could be replaced by equivalent means.

We claim:

1. A deposition method for vapor deposition of a film of fluorine-containing glass on a substrate, in which said glass comprises various constituents, wherein said substrate is put into contact with vapor flows of the various constituents of said glass to form said film of fluorine-containing glass on said substrate, wherein said vapor flows are emitted simultaneously from at least two crucibles, wherein said at least two crucibles comprise a first crucible and at least one additional crucible, wherein said first crucible contains a host bath which contains mixed therein main metal fluorides that are to constitute said fluorine-containing glass, and said at least one additional crucible contains materials constituted by at least one rare earth halide to serve as dopants in the glass.

2. A deposition method according to claim 1, wherein the at least one additional crucible contains materials to serve as dopants satisfying the relationship:

$$xYX_3 + (1-x)LnX_3$$

where:

$0 \leq x \leq 1$;

Ln=at least one of La, Ce, Pr, Nd, Pm, Sm, Eu, Gd, Tb, Dy, Ho, Er, Tm, Yb, and Lu;

Y=yttrium;

X=F or Cl; and

LnX$_3$ represents a rare earth halide or a mixture of rare earth halides.

3. A deposition method according to claim 1, wherein the amount of said materials to serve as dopants in the glass is no more than 15% in moles relative to the amount of said main metal fluorides.

4. A deposition method according to claim 1, wherein the vapor flow emitted by said first crucible consists of the following composition (in molar %; total 100%):

30 to 50 PbF$_2$ 30 to 50 GaF$_3$ or FeF$_3$ or CrF$_3$ 0 to 30 ZnF$_2$ or CuF$_2$ 1 to 5 MnF$_2$ or CdF$_2$ or CoF$_2$ 1 to 5 InF$_3$ 0 to 10 AlF$_3$ 0 to 10 at least one metal fluoride containing a metal which is different from any other metal contained in a metal fluoride in the vapor flow.

5. A deposition method according to claim 4, wherein said first crucible contains a host bath consisting of the following composition on a molar % basis:

9 to 26 YF$_3$ 19 to 28 BaF$_2$ 35 to 40 InF$_3$ 18 to 25 MnF$_2$ or CdF$_2$ or ZnF$_2$ or CoF$_2$ 0 to 10 at least one metal fluoride containing a metal which is different from any other metal contained in a metal fluoride in the host bath.

6. A deposition method according to claim 5, wherein the at least one metal fluoride is selected from the group consisting of metal fluorides whose metals have octahedral coordination and alkali metal fluorides.

7. A deposition method according to claim 4, wherein the at least one metal fluoride is selected from the group consisting of metal fluorides whose metals have octahedral coordination and alkali metal fluorides.

8. A deposition method according to claim 1, wherein the material of said substrate is a fluorine-containing glass, alumina, silica, carbon, a metal, silicon, or a semiconductor material.

* * * * *